United States Patent [19]
Azar

[11] Patent Number: 5,121,290
[45] Date of Patent: Jun. 9, 1992

[54] CIRCUIT PACK COOLING USING PERFORATIONS

[75] Inventor: Kaveh Azar, Westwood, Mass.

[73] Assignee: AT&T Bell Laboratories, Murray Hill, N.J.

[21] Appl. No.: 542,613

[22] Filed: Jun. 25, 1990

[51] Int. Cl.⁵ .............................................. H05H 7/20
[52] U.S. Cl. ................................................... 361/384
[58] Field of Search ............................. 361/382–385, 361/400

[56] References Cited

U.S. PATENT DOCUMENTS

| | | | |
|---|---|---|---|
| 2,187,011 | 1/1940 | Braden | 361/382 |
| 3,967,874 | 7/1976 | Calabro | 361/384 |
| 4,393,437 | 7/1983 | Bell et al. | 361/383 |
| 4,399,484 | 8/1983 | Mayer | 361/382 |
| 4,408,255 | 10/1983 | Adkins | 361/382 |
| 4,839,774 | 6/1989 | Hamburgen | 361/383 |
| 4,851,965 | 7/1989 | Gabuzda et al. | 361/383 |

FOREIGN PATENT DOCUMENTS 2-86498  11/1989  Japan ................... 361/383

*Primary Examiner*—Gregory D. Thompson
*Attorney, Agent, or Firm*—L. H. Birnbaum

[57] ABSTRACT

Disclosed is an apparatus for providing forced air cooling of components mounted on circuit boards in a stacked configuration. A plurality of perforations is provided in the circuit boards so that air flow in the channel between boards causes air to be sucked through the perforations to eliminate stagnant areas between components and provide local jet impingement cooling.

6 Claims, 3 Drawing Sheets

CIRCUIT PACK COOLING USING PERFORATIONS

BACKGROUND OF THE INVENTION

This invention relates to forced air cooling of circuit packs which are arranged in a stacked configuration.

The density of heat generating components in electronic circuit packs continues to rise, bringing with it increased concern about proper cooling of the circuits. Forced fluid cooling is expected to be a necessity in the near future, and several proposals have already been made to facilitate such cooling. For example, jet impingement of air onto the heat generating component can be provided through separate plenums (see, e.g., U.S. Pat. No. 4,851,965 issued to Gabuzda et al), or through the circuit board assembly itself (see, e.g., K. Azar U.S. patent application Ser. No. 522,290, filed May 11, 1990 and assigned to the present assignee). It has also been suggested that air can be blown onto the components through holes in the enclosures or shields surrounding the circuit components (see, e.g., U.S. Pat. No. 4,393,437 issued to Bell et al, and U.S. Pat. No. 4,408,255 issued to Adkins). It has been suggested further that holes in the circuit boards themselves could allow air to impinge on components in circuit packs which are stacked (see U.S. Pat. No. 4,399,484 issued to Mayer).

In stacked configurations which are open and where the air is flowing essentially parallel to the circuit packs, there is a problem of stagnant air pockets forming in areas between components. This problem can be solved by introducing turbulators on the wall facing the circuit pack components (see K. Azar U.S. patent application Ser. No. 527,602, filed May 23, 1990).

It is desirable to provide an alternative solution to this problem which has the potential for lower cost.

SUMMARY OF THE INVENTION

This and other objects are achieved in accordance with the invention which is a fluid-cooled circuit pack comprising a first circuit board having a front surface with at least one heat generating component mounted thereon. Another surface is disposed opposite to the front surface and is spaced in relationship thereto so as to form a channel for the flow of cooling fluid over said component in a direction essentially parallel to said surfaces. An array of perforations is provided at least in the said another surface so that the flow of cooling fluid in the channel causes fluid above the said another surface to be drawn into the channel.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
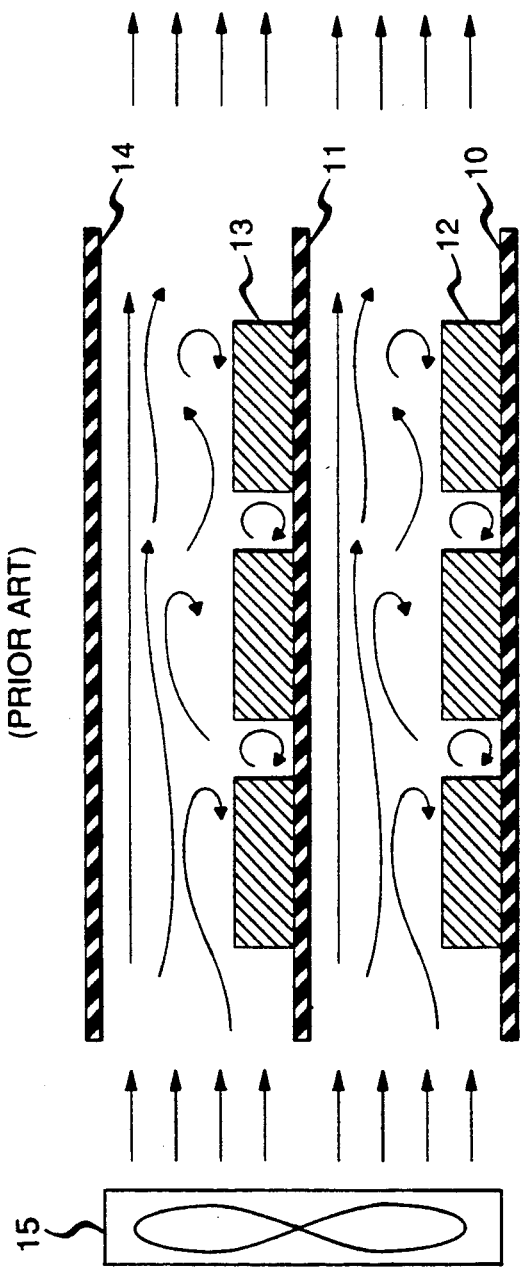
FIG. 1 is a side view of a circuit pack assembly including a fluid flow pattern in accordance with a prior art configuration.

FIG. 1 illustrates a typical circuit packet assembly which includes two circuit boards, 10 and 11, in a stacked configuration. Each circuit board includes at least one heat generating component. e.g., 12 and 13, mounted on the front surface of the circuit board. Two channels for the flow of fluid, indicated by the arrows, are shown. One is provided between the back surface of circuit board 11 and the front surface of circuit board 10. The other channel is provided between the front surface of circuit board 11 and another surface 14, which could be a cover or another circuit board in the stack. It will be appreciated that several such channels are formed in a typical shelf of circuit packs.

The fluid, which can be air or liquid, is forced into the channel by some means, such as a fan 15, in a direction which is essentially parallel to the surfaces of the circuit boards. As the air impinges on the components, the flow is as schematically illustrated. It will be noted that areas of stagnant air tend to form between the components in both channels, thereby inhibiting effective cooling.

Figure 2:
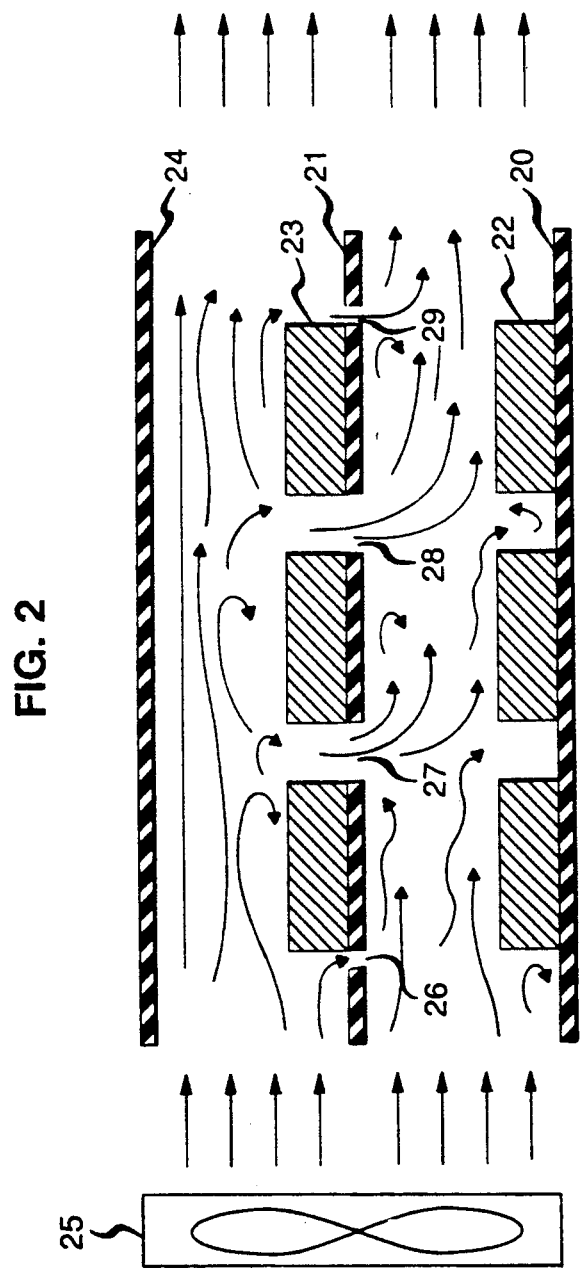
FIG. 2 is a side view of a circuit pack assembly including a fluid flow pattern in accordance with an embodiment of the invention.
Figure 3:
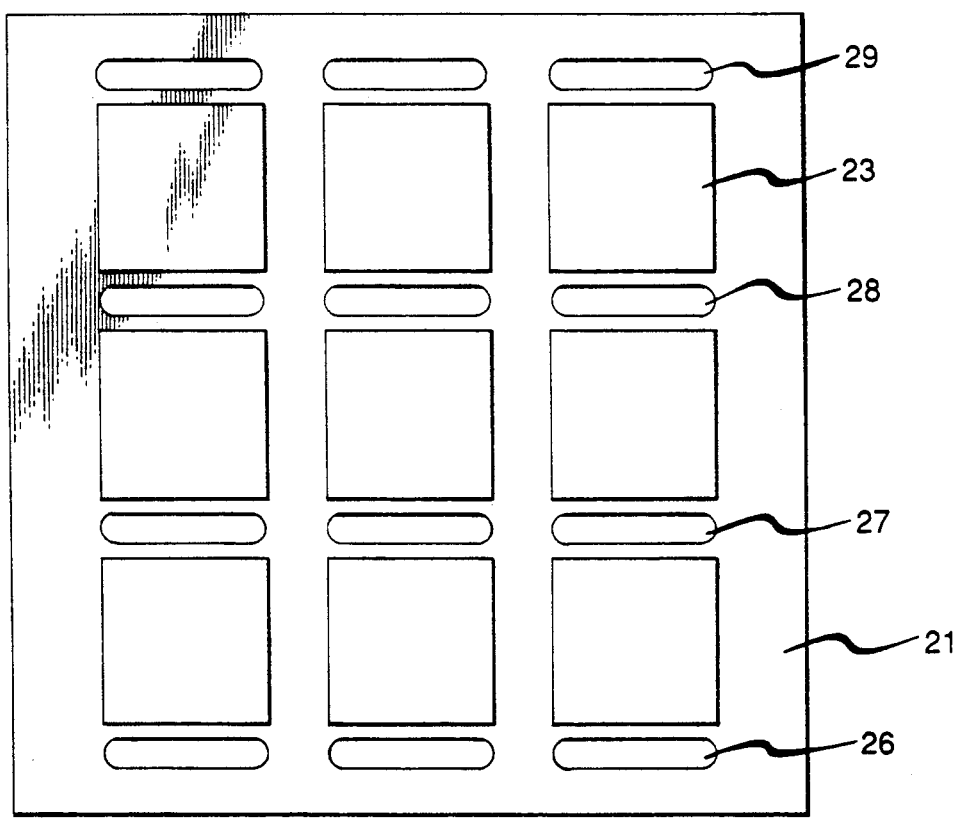
FIG. 3 is a top view of a portion of the assembly in FIG. 2 in accordance with the same embodiment.

FIGS. 2 and 3 illustrate, in side and top views, respectively, a circuit pack assembly with improved cooling in accordance with the invention. The assembly, again, includes circuit boards, 20 and 21, with components, e.g. 22 and 23, mounted on their front surfaces. Two channels are also shown, one formed between boards 20 and 21 and one formed between board 21 and surface 24. Air is forced into the channels by fan 25 in a direction essentially parallel to the boards as before. Here, however, an array of fairly large perforations, e.g. 26-29, are formed through board 21 adjacent to each component. As illustrated in FIG. 3, these perforations preferably extend the full length of each component, which is typically 1-2.5 cm. Also, the perforations are fairly wide, i.e. at least 0.60 cm, in order to provide the improved cooling capabilities.

It will be appreciated that air is forced into the channels, as before, essentially parallel to boards 20 and 21 and surface 24. Here, however, the air in the channel just below board 21 will be moving at a faster rate than the stagnant areas adjacent to the components in the channel above board 21. According to Bernoulli's principle, this will result in areas of lesser pressure below the holes 26-29, thereby causing air from the channel above board 21 to be sucked into the channel below. The areas of stagnant air in the channel bounded by board 21 and cover 24 will, therefore, be dissipated. In addition, the areas of stagnant air in the channel bounded by 20 and 21 will also tend to bread up as a result of the increased air turbulence caused by the air being sucked into the channel from above. Further, the components (e.g., 22) on board 20 can receive direct impingement of the cooling fluid through the perforations. Enhanced cooling of the components in both channels is therefore, realized.

For optimum results, the perforations 26-29 should be located adjacent to each heat generating component in the path of the air flow as shown in FIG. 3 Fluid flow should, preferably, at least 00.75 m/s to ensure that adequate amounts of fluid will be drawn through the perforations. The area of each perforation should be at least 0.6 cm$^2$ for the same reason.

While the invention has been illustrated wi the use of surface mount components 22 and 23, boards which include through-hole mounted components can also benefit by placing the perforations adjacent to the through-holes. Known cooling fluids, other than air, can also be employed.

Various additional modifications will become apparent to those skilled in the art. All such variations which basically rely on the teachings through which the invention has advanced the art are properly considered within the scope of the invention.

I claim:

1. A fluid cooled circuit pack assembly comprising:
   a first circuit board having a front surface with a first array of heat generating components mounted thereon;
   a second circuit board with a front and back surface, the front surface having a second array of heat generating components mounted thereon and the back surface disposed opposite to the front surface of the first circuit board and in spaced relationship thereto so as to form a channel for the flow of cooling fluid over said first array of components in a direction essentially parallel to said surfaces; and
   an array of perforations defined through the front and back surfaces of the second circuit board so that flow of cooling fluid in the channel causes fluid above the front surface of the second circuit board to be drawn into the channel as a result of differential pressure between the channel and areas of stagnant fluid between the components of the second array.

2. The circuit pack assembly according to claim 1 wherein the perforations are at least 0.60 cm wide and extend the length of an adjacent heat generating component.

3. The circuit pack assembly according to claim 1 wherein the perforations have an area of at least 0.6 cm$^2$.

4. The circuit pack assembly according to claim 1 further comprising means for forcing fluid into said channel in a direction essentially parallel to the circuit boards.

5. The circuit pack assembly according to claim 4 wherein the means produced a fluid flow with a velocity of at least 0.75 m/s.

6. The circuit pack assembly according to claim 1 wherein the perforations are placed in the second circuit board adjacent side of each component which is perpendicular to the flow of cooling fluid.

* * * * *